United States Patent
Wang

[11] Patent Number: 5,880,479
[45] Date of Patent: Mar. 9, 1999

[54] WAFER ALIGNER APPARATUS USING DIFFERENT DIAMETER ROLLERS

[75] Inventor: Horng-Jong Wang, Taichung, Taiwan

[73] Assignee: Vanguard International Semiconductor Corporation, Hsinchu, Taiwan

[21] Appl. No.: 738,075

[22] Filed: Oct. 25, 1996

[51] Int. Cl.⁶ .................................................. G01V 8/10
[52] U.S. Cl. .................. 250/548; 250/559.3; 250/559.4; 250/222.1; 156/567; 414/757; 414/936; 356/400
[58] Field of Search ............................... 250/223 R, 221, 250/222.1, 215, 559.29, 559.3, 559.33, 559.37, 559.4, 559.42, 548; 356/399, 400, 429; 414/935, 936, 937, 938, 939, 416, 417, 418, 331, 433, 404, 754, 757, 777; 156/345, 567

[56] References Cited

U.S. PATENT DOCUMENTS

| | | |
|---|---|---|
| 3,964,957 | 6/1976 | Walsh ........................................ 156/345 |
| 4,388,140 | 6/1983 | Nakazato et al. ......................... 156/345 |
| 4,568,234 | 2/1986 | Lee et al. .................................. 414/404 |
| 4,944,650 | 7/1990 | Matsumoto ............................... 414/757 |
| 5,194,743 | 3/1993 | Aoyama et al. .......................... 250/548 |
| 5,211,794 | 5/1993 | Enomoto et al. ......................... 156/345 |
| 5,239,182 | 8/1993 | Tateyama et al. ........................ 414/416 |
| 5,354,995 | 10/1994 | Endo et al. ............................ 250/223 R |

*Primary Examiner*—Edaward P. Westin
*Assistant Examiner*—John R. Lee
*Attorney, Agent, or Firm*—Bacon & Thomas, PLLC

[57] ABSTRACT

The present invention is an orientation flat aligner for preventing the angle deviation of the flat edge of the wafer. This invention applies two new designs to the aligner: (1) The two parallel rollers with different radius instead of two parallel rollers the same radii prevent the problem of the angle deviation to line up the flat edge of the wafer. (2) placing the photosensor on the orientation flat aligner instead of on the sensor bracket avoids the detection error because of the photosensor position relate to the orientation flat aligner position and saves time on checking whether the flat edge of the wafer line up or not.

10 Claims, 9 Drawing Sheets

WAFER ALIGNER APPARATUS USING DIFFERENT DIAMETER ROLLERS

FIELD OF THE INVENTION

The present invention relates to an orientation flat aligner and, more particularly, to an orientation flat aligner for preventing the angle deviation of the flat edge of the wafer.

BACKGROUND OF THE INVENTION

Generally, the wafers are moved into the furnace by the carrier. There is a carrier $I_{(input)}/O_{(output)}$ port on the furnace. FIG. 1 shows the front view of the furnace. From the FIG. 1, the carrier I/O port is located on the middle position of the furnace. It is the rectangular opening for placing two carriers 14. A stage is under the carrier I/O port and as a base to support the carrier. There are two sets of orientation flat aligner in the stage 15. FIG. 2 shows the cross-section view of the furnace. FIG. 3 shows the cross-section view of magnifying the stage 15 and the carrier I/O port. The carrier 14 includes one cassette and four piers. There is a photosensor bracket among the four piers. The stage includes two orientation flat aligners 20.

FIG. 4 shows the front view of the orientation flat aligner. An orientation flat aligner includes four devices: one fixed shell 22, two rollers 24, wafer counters 26, and a driver 28. The driver 28 contains a ring roller 30 connected to the power supplier of the furnace and a belt tied with the driving roller and the two rollers as shown in FIG. 5. When the power supplier supplies the energy to the driving roller, the driving roller will rotate and drive the two rollers to work by the belt. FIG. 6 shows the top view of the orientation flat aligner. The outline of two rollers is serrated from the FIG. 6. This is because the rollers 24 combine with two different radius rings, as shown in FIG. 7. Generally, the wafers were placed on the depressed part of the roller and secured by the bigger rings of the roller. The stage 15 is a hollow fixed structure. An orientation flat aligner 20 will be elevated from the stage to the photosensor bracket 19 when the orientation flat aligner begin work. The photosensor bracket includes a photosensor 32 and a reflecting plate 34. When the orientation fiat aligner is elevated, the rollers will raise the wafers up a little bit to rotate the wafers to made the flat edge of the wafers line up. After the fiat edge of the wafers lines up, the orientation flat aligner will move down to the stage position and then the photosensor employ infrared ray to check the result. If the flat edge of the wafers line up, the infrared ray can reach the reflecting plate 34 through the path 33 and reflect back the photosensor through the path 35, as shown in FIG. 8.

The operating procedure of conventional orientation flat aligner of the furnace: (1) Put carrier into the carrier I/O port. (2) Elevate the orientation fiat aligner to the upstage position, the position of photosensor bracket. (3) Rotate the parallel rollers of orientation flat aligner about forty seconds. (4) Count the number of the wafers by the wafer counters. (5) Move the orientation flat aligner down to the stage position. (6) Check the flat edge of the wafers by the photosensor on the photosensor bracket. (7) If the flat edge of the wafers do not line up, repeat the procedure from the second step to the sixth step until the the flat edge of the wafers line up. After the flat edge of the wafers line up, the wafers are loaded on the boat to continent the next process.

There are two disadvantages about the conventional orientation flat aligner. One is the two parallel rollers with the same size. In normal condition, when the flat edge of the wafers line up, there are two degree angle deviation occurred on the right hand by arrows 37 in the FIG. 9. If the flat edge of the wafer has touched on the rollers when the wafer loaded on the carrier were placed into the carrier I/O port, it is no useful to rotate roller to make the flat edge of the wafer reach the correct position. Thus, the undesired condition will happen as shown in FIG. 10. The undesired condition is that the angle deviation about two degrees occur on the left hand, indicated by arrow 38. This condition will make the wafers drop or break when the flow rate of gas is too strong or the boat moves in the furnace. The another is the photosensor located on the photosensor bracket. The photosensor detect the the flat edge of the wafers whether the flat edge of the wafers line up or not, after the rollers stop rotating and then the orientation flat aligner move back the stage. If the flat edge of the wafers do not line up, repeat the procedure from the second step to the sixth step until the flat edge of the wafers line up. This design which the photosensor are not separated from the orientation flat aligner wastes time for checking the flat edge of the wafers and increases the mis-detection chance to damage the wafers.

SUMMARY OF THE INVENTION

In accordance with the present invention, an orientation flat aligner for preventing the angle deviation of the the flat edge of the wafer is disclosed. The equipment of his invention improves the two disadvantages, the angle deviation of the flat edge of the wafer and the time waste for checking the flat edge of the wafers. There are two new designs in the orientation flat aligner of this invention. First, the two parallel rollers with different radius instead of two parallel rollers the same radii prevent the problem of the angle deviation to line up the the flat edge of the wafer. Second, placing the photosensor on the orientation flat aligner instead of on the sensor bracket avoids the detection error. The two new designs not only avoid the angle deviation of the flat edge of the wafers but also shorten the checking time.

In one embodiment, the orientation flat aligner includes seven main devices: (1) a fixing shell connected to the stage of the furnace, wherein the fixing shell is for protecting the devices of the aligner and fixing wafers. (2) a big roller connected to the fixing shell, wherein the big roller combine with different radius rings and the big roller is for rotating the wafers to line up the flat edge of the wafers. (3) a small roller connected to the fixing shell and paralleled with the big roller, wherein the small roller combines with different radius rings and the small roller is for rotating the wafers to line up the the fiat edge of the wafers. (4) several wafer counters located on the center between the small roller and the big roller and fixed over the big roller and the small roller, wherein the wafer counters are for counting the number of the wafers. (5) a driver located under the small roller and the big roller, wherein the driver connected to the power supplier of the firnace and also connected to the big roller and the small roller and the driver is for making the small roller and the big roller work. The driver comprises a driving roller and a belt. (6) a photosensor located on the fixing shell and between the big roller and the small roller, wherein the photosensor is for checking whether the the flat edge of the wafers line up or not utilized the photo-ray. (7) a reflecting plate located on the fixing shell opposite to the photosensor, wherein the reflecting plate is for reflecting the photo-ray from the photosensor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
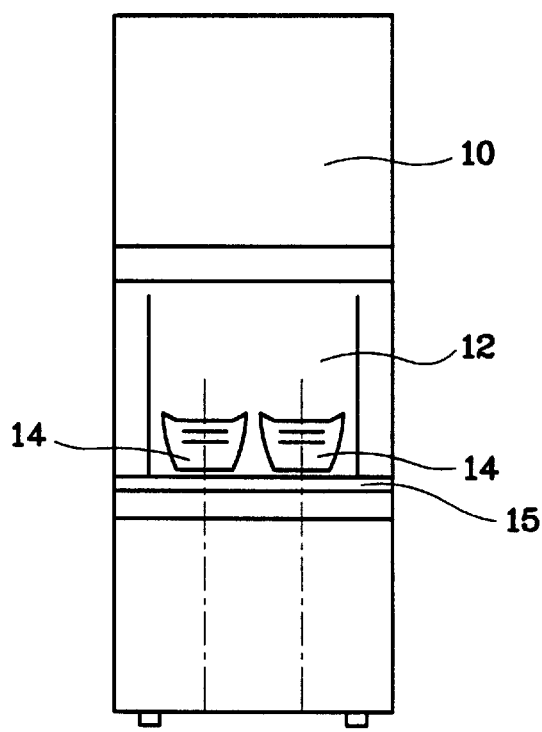
FIG. 1 shows the front view of the furnace.
Figure 2:
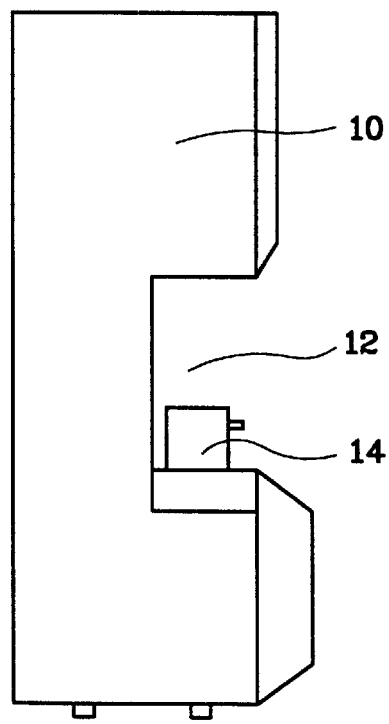
FIG. 2 shows the cross-section view of the furnace.
Figure 3:
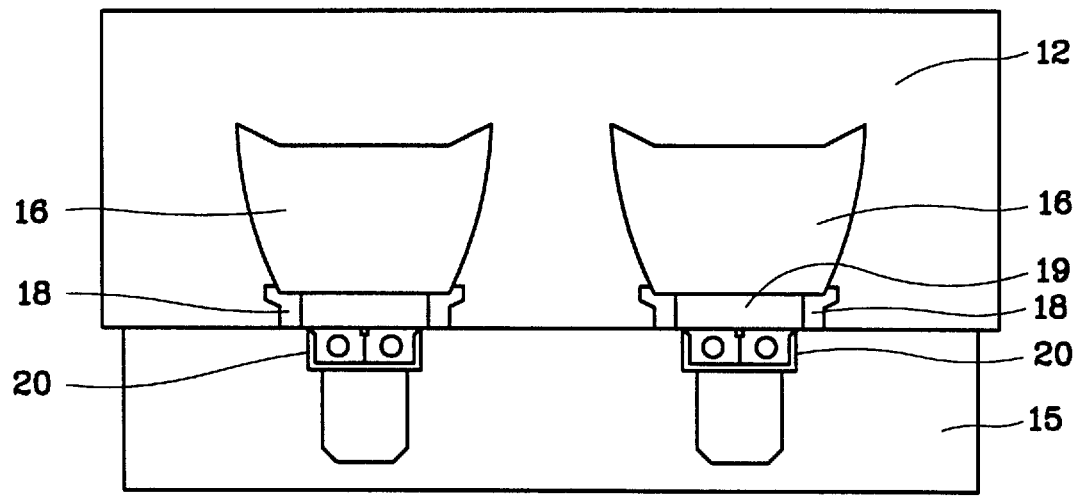
FIG. 3 shows the cross-section view of magnifying the stage and the carrier I/O port of the conventional furnace.
Figure 4:
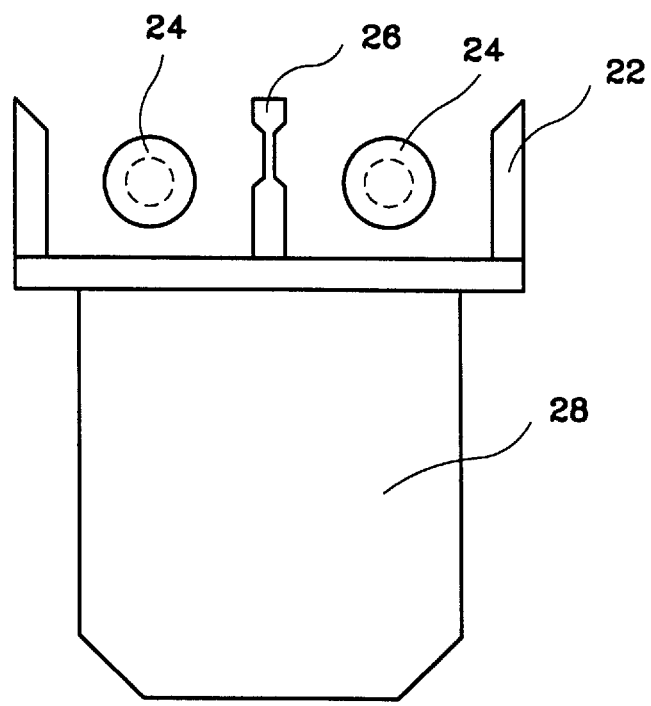
FIG. 4 shows the front view of the conventional orientation flat aligner.
Figure 5:
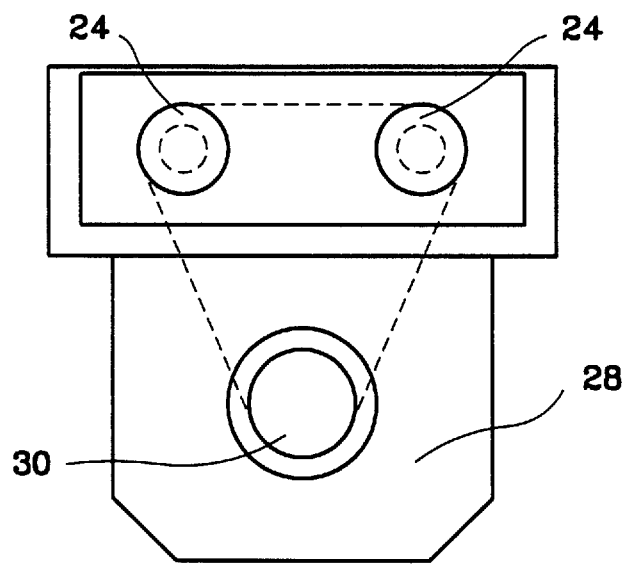
FIG. 5 shows the cross-section view of the conventional orientation flat aligner.
Figure 6:
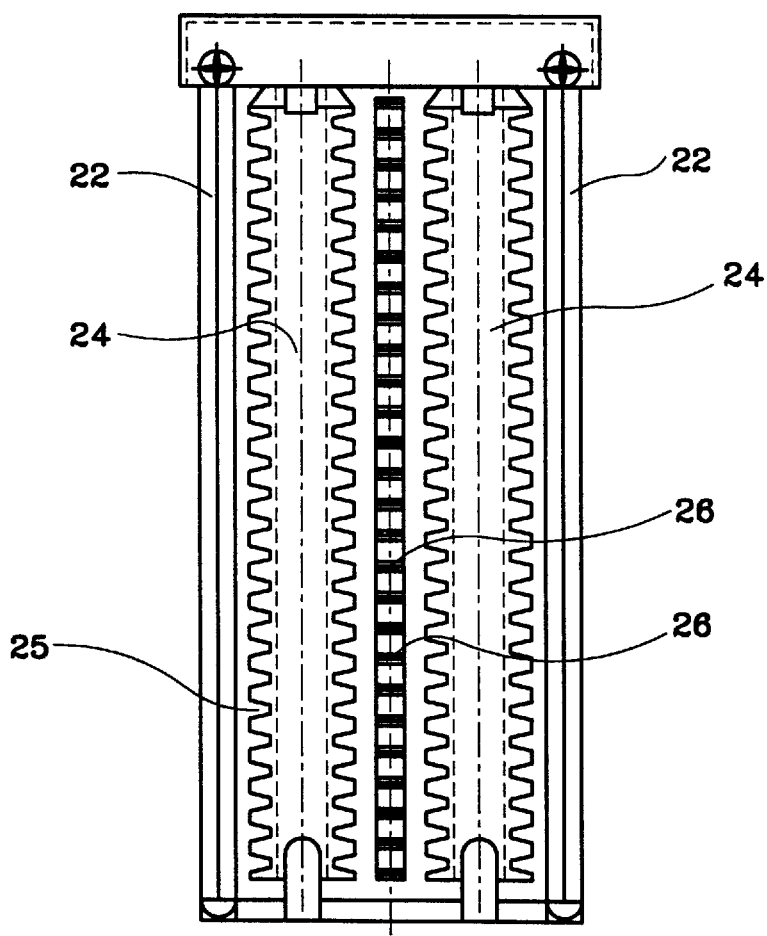
FIG. 6 shows the top view of the conventional orientation flat aligner.
Figure 7:
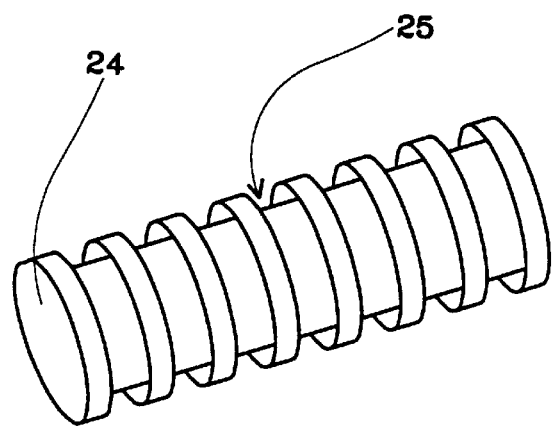
FIG. 7 shows the structure of the rollers of the conventional orientation flat aligner.
Figure 8:
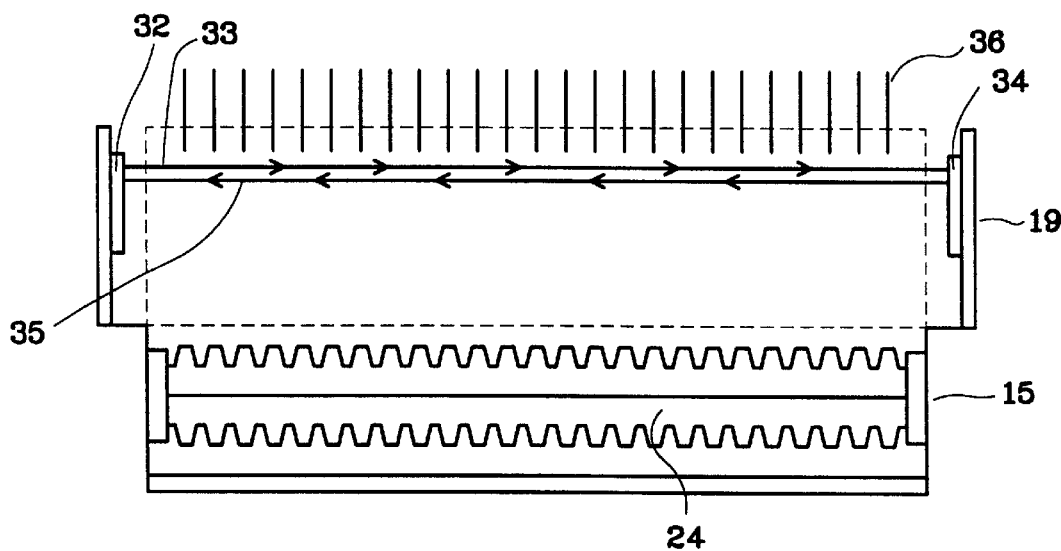
FIG. 8 shows the cross-section view of the conventional photosensor and the conventional orientation flat aligner.
Figure 9:
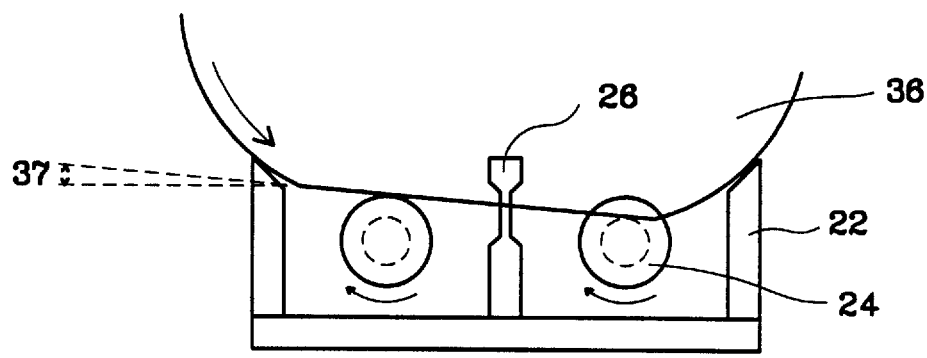
FIG. 9 shows the cross section view of the ideal angle deviation of the flat edge of the wafers.
Figure 10:
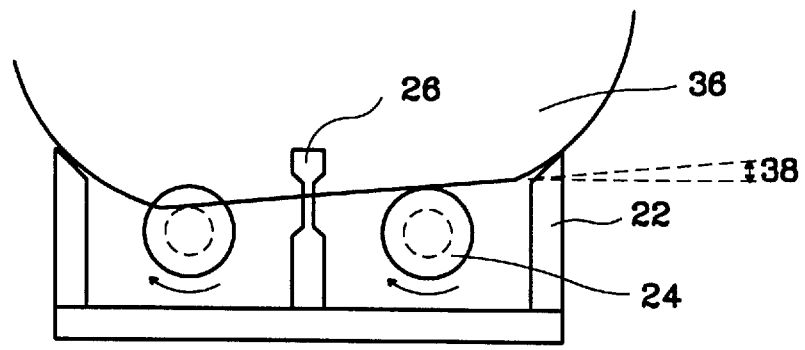
FIG. 10 shows the cross section view of the undesired angle deviation of the flat edge of the wafers.
Figure 11:
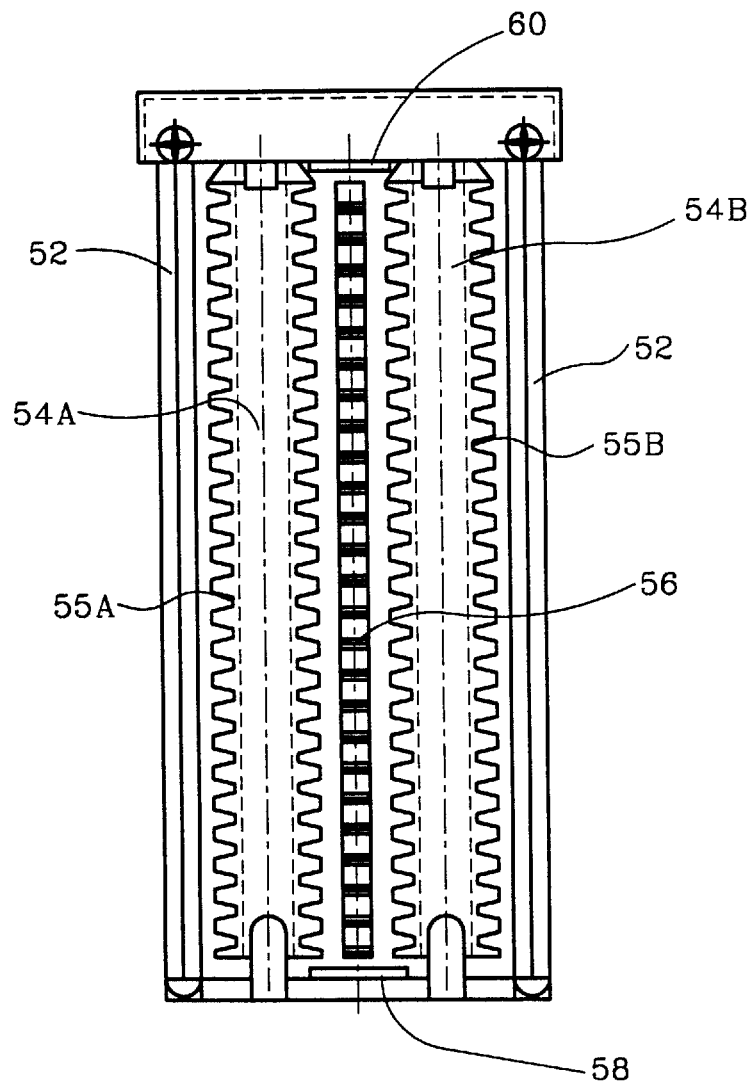
FIG. 11 shows the top view of the orientation flat aligner of this invention.
Figure 12:
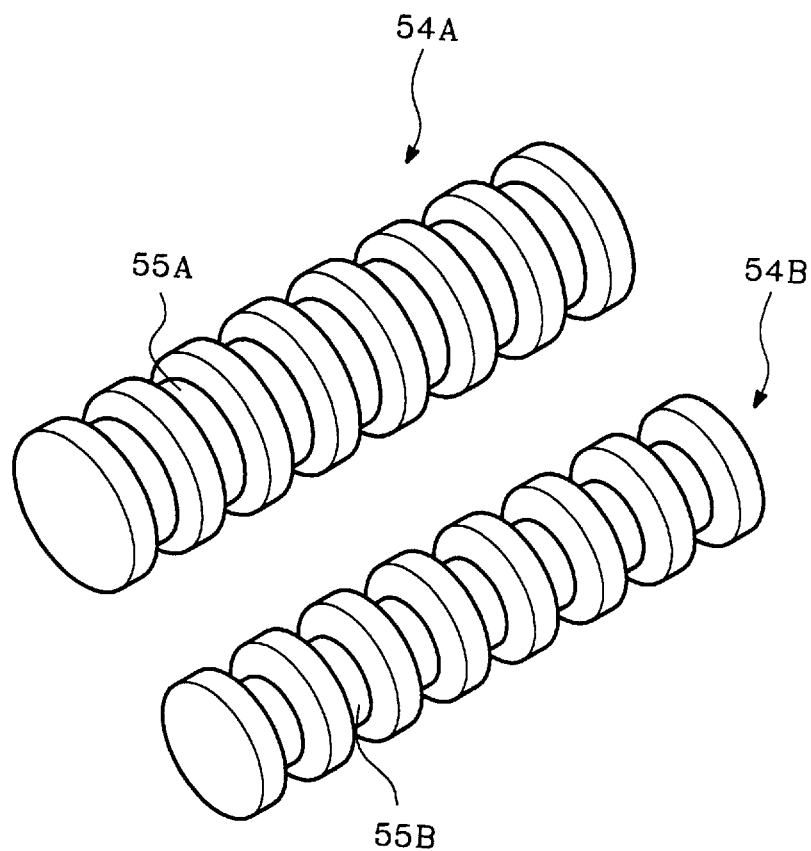
FIG. 12 shows the structure ofthe rollers ofthe orientation flat aligner of this invention.
Figure 13:
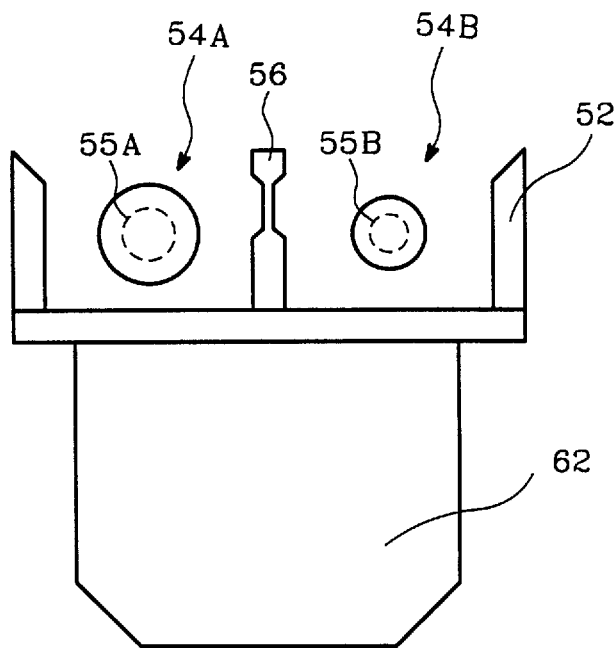
FIG. 13 shows the front view of the orientation flat aligner of this invention.
Figure 14:
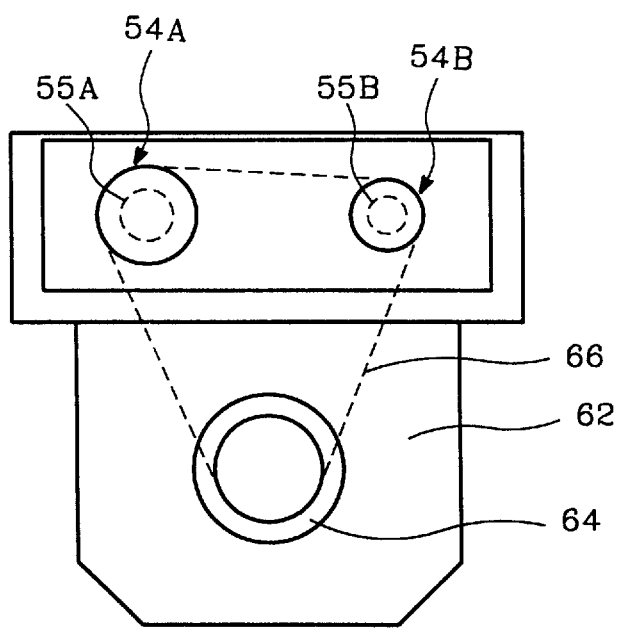
FIG. 14 shows the cross-section view of the orientation flat aligner of this invention.

As shown in FIG. 11, the orientation flat aligner 50 of this invention includes a fixing shell 52, a first roller 54A having a plurality of first recessed portions 55A, a second roller 54B having a plurality of second recessed portions 55B, a plurality of wafer counters 56, a photosensor 58, and a reflecting plate 60. Each of the first and the second recessed portions 55A and 55B encircle, respectively, the first roller 54A and the second roller 54B to form a housing space for a portion of a vertical wafer, as shown in FIG. 12. Thus, the outline of the first roller 54A appears to be serrated, and a similar outline is seen for the second roller 54B. A fixing shell is connected to the stage of the furnace. The ends of first roller 54A are connected to the two sides of the fixing shell 52. The first recessed portions 55A are with a radius of about 20 mm and the first roller 54A is with a radius of about 26 mm. The ends of second roller 54B are also connected to the two sides of the fixing shell 52 so that the second roller 54B is parallel with the first roller 54A. The second recessed portions 55B have a radius of about 14 mm and the second roller 54B has a radius of about 14 mm. Twenty-five pairs of wafer counters 56, which is the same number as of that recessed portions, are located midway between second roller 54B and first roller 54A. The wafer counters 56 are at a height which is above that of the first roller 54A. The wafer counters are for counting the number of the wafers. The wafer counters employ the photodector to detect the number of the wafers. If a wafer stands vertically in any of the first recessed portions of the first rollers and a corresponding recessed portion of the second rollers, the wafer will obstruct the ray emitted from the detector so that one wafer is counted. Thus, the wafer counters can count the number of wafers. A photosensor 58 is located on the fixing shell 52 between the first roller 54A and the second roller 54B. The photosensor 58 emits and receives an infrared ray for checking whether the flat edges of the wafers are aligned. A reflecting plate 60 is located on the fixing shell 52 opposite to the photosensor 58. The reflecting plate 60 is for reflecting the infrared ray emitted by the photosensor 58 back to the photosensor 58. FIG. 13 shows a front view of the orientation flat aligner 50 of this invention. In the FIG. 13, the solid circles shown in the figure represent individually the first roller 54A and the second roller 54B. The dashed circles represent individually the first recessed portion 55A and the second recessed portion 55B. A driver (not shown) is located in a base 62 which underlies a portion of the first roller 54A and the second roller 54B. The driver (not shown) and a driving roller 64 are connected to the first roller and the second roller by a belt 66, as shown in FIG. 14.

Figure 15:
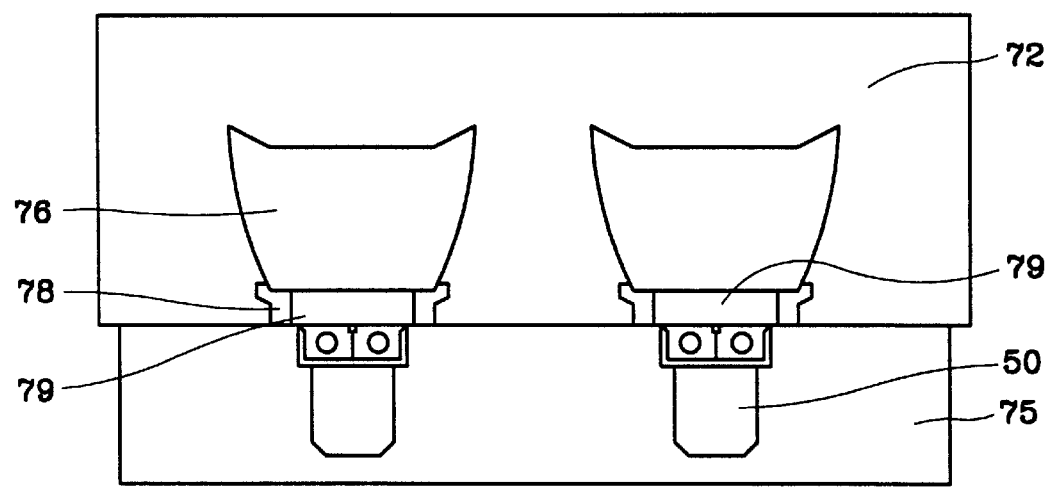
FIG. 15 shows the cross section view of magnifying the stage and the carrier I/O port of the furnace of this invention.

As shown in FIG. 15, the wafers (not shown) are arranged in a wafer carrier 76 (a major portion) and 78 (a supporting portion) and placed into carrier I/O port 72 which is ready for performing line up of flat edges of wafers by flat aligner 50. When the orientation flat aligner 50 is elevated, the recessed portions 55A and 55B of the rollers 54A and 54B will raise the wafers up a little bit to rotate the wafers and line up the flat edge of the wafers. When the orientation flat aligner 50 is operating, the photosensor 58 will emit an infrared ray to check whether all the flat edges of wafers are lined up or not. If the flat edge ofthe wafers line up, the infrared ray can reach the reflecting plate 60 and reflect back the photosensor. At this time, the orientation flat aligner 50 will stop. Thereafter, the orientation flat aligner 50 will move vertically down to the stage position 75, as shown in FIG. 15.

The present invention provides two advantages: (1) in comparison with the above-discussed prior art arrangements, an approximately 2° deviation angle between flat edges of the wafers can be eliminated as a result of the two different radii rollers 54A and 54B of the present invention. —(2) since the photosensor 58 is located on the fxing shell 52 in the present invention, it can check if all the flat edges of wafers are lined up in real time, thus significantly save processing time.

Although specific embodiment has been illustrated and described, it will be obvious to those skilled in the art that various modifications may be made without departing from the which is intended to be limited solely by the appended claims.

The embodiments of the invention in which an exclusive property or privilege is claimed are defined as follows:

1. An aligner apparatus to line up flat edges of wafers, wherein said aligner apparatus comprises:

fixing shell means for protecting said aligner apparatus;

a first roller connected to said fixing shell means, said first roller comprising a plurality of first recessed portions that encircle said first roller, said plurality of first recessed portions being mutually spaced apart, each of said first recessed portions being arranged to house a first portion of a respective one of the wafers;

a second roller parallel to said first roller and connected to said fixing shell means, said second roller comprising a plurality of second recessed portions that encircle said second roller, said plurality of second recessed portions being mutually spaced apart, each of the second recessed portions being arranged to house a second portion of a respective one of the wafers, a radius of said second roller being smaller than that of said first roller, said plurality of second recessed portions thereby having a radius smaller than that of said plurality of first recessed portions;

a plurality of wafer counters located approximately midway between said first roller and said second roller for counting the wafers;

at least one photosensor located on said shell fixing means and between said first roller and said second roller for emitting and receiving infrared light to check whether the flat edges of the wafers are aligned; and reflecting means on said fixing shell means at a position opposite said photosensor for reflecting said infrared light emitted by said photosensor back to said photosensor.

2. The aligner apparatus according to claim 1, wherein said first roller has a radius of about 26 mm, and said plurality of first recessed portions have a radius of about 20 mm.

3. The aligner apparatus according to claim 1, wherein said second roller has a radius of about 22 mm, and said plurality of second recessed portions has a radius of about 14 mm.

4. The aligner apparatus according to claim 1, wherein said number of pairs of said wafer counters is the same as the number of said first recessed portions.

5. The aligner apparatus according to claim 1, further comprising a driving means for driving said first and second rollers, wherein said driving means comprises:

a driving roller connected to a power supply; and a belt that engages said driving roller, said first roller, and said second roller to transmit power from said driving roller to said first and second rollers.

6. An aligner apparatus to line up flat edges of wafers, wherein said aligner apparatus comprises:

fixing shell means for protecting said aligner apparatus;

a first roller connected to said fixing shell means, said first roller comprising a plurality of first recessed portions that encircle said first roller, said plurality of first recessed portions being mutually spaced apart, each of said first recessed portions being arranged to house a first portion of a respective one of the wafers;

a second roller parallel to said first roller and connected to said fixing shell means, said second roller comprising a plurality of second recessed portions that encircle said second roller, said plurality of second recessed portions being mutually spaced apart, each of the second recessed portions being arranged to house a second portion of a respective one of the wafers, a radius of said second roller being smaller than that of said first roller, said plurality of second recessed portions thereby having a radius smaller than that of said plurality of first recessed portions;

driving means connected to said first roller and said second roller for driving said first roller and said second roller;

at least one photosensor located on said shell fixing means and between said first roller and said second roller for emitting and receiving infrared light to check whether the flat edges of the wafers are aligned; and reflecting means on said fixing shell at a position opposite to that of said photosensor for reflecting said infrared light emitted by said photosensor back to said photosensor.

7. The aligner apparatus according to claim 6, wherein said first roller has a radius of about 26 mm, and said plurality of first recessed portions have a radius of about 20 mm.

8. The aligner apparatus according to claim 6, wherein said second roller has a radius of about 22 mm, and said plurality of second recessed portions has a radius of about 14 mm.

9. The aligner apparatus according to claim 6, wherein said number of pairs of said wafer counters is the same as the number of said first recessed portions.

10. The aligner apparatus according to claim 6, wherein said driving means comprises:

a driving roller connected to a power supply; and a belt that engages said driving roller, said first roller, and said second roller to transmit power from said driving roller to said first and second rollers.

* * * * *